April 21, 1970 H. MOLL ET AL 3,507,038
METHOD OF MANUFACTURING CONDUCTORS HAVING COMPONENTS
OF SUPER AND NORMAL CONDUCTIVITY
Filed Oct. 9, 1967

United States Patent Office 3,507,038
Patented Apr. 21, 1970

3,507,038

METHOD OF MANUFACTURING CONDUCTORS HAVING COMPONENTS OF SUPER AND NORMAL CONDUCTIVITY

Helmut Moll, Nuremberg, Günther Bogner, Erlangen, Richard Dötzer, Nuremberg, and Richard Maier, Erlangen, Germany, assignors to Siemens Aktiengesellschaft Filed Oct. 9, 1967, Ser. No. 673,569
Claims priority, application Germany, Oct. 25, 1966, S 106,692
Int. Cl. H01j 11/00
U.S. Cl. 29—599 14 Claims

ABSTRACT OF THE DISCLOSURE

A method of manufacturing conductors having components of super and normal conductivity and particularly adapted for use as superconductive coils. At least one elongated superconductor is ultrasonically welded along its entire length to a normal conductor which may be made of a metal selected from the group consisting of copper or aluminium.

Figure 1:
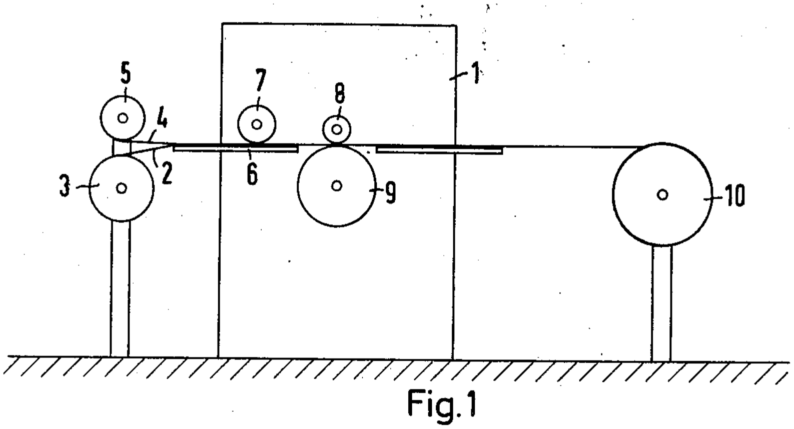

Our invention relates to a method for manufacturing conductors composed of metallic components of super and normal electrical conductivity and especially adapted for use in superconductive coils.

In the construction of superconductive coils, particularly for relatively large superconductive magnets, it has proved to be advantageous to use so-called stabilized conductors composed of superconductive metals and of normal conductive metals which are of good electrical conductivity at the operating temperature of the coil. In order to achieve a good electrical stability for the coil, the cross section and the conductivity of the normal conducting metal at low cryostatic temperatures should be such that the entire conductor does not experience any substantial current degradation under good refrigeration and the structure should be such that when the superconductor undergoes transition in the critical state by exceeding the critical current, the current which flows through the superconductor is taken over either entirely or in part by the metal of normal conductivity. In this way the transition of the superconductor between the superconducting and normal conducting states can take place continuously and in a reversible manner, while achieving the superconductive state again with a relatively small reduction in current.

There are known conductors composed of superconducting and normal conducting metals wherein a plurality of niobium-zirconium wires extend parallel to each other and are carried by a copper tape. During the mounting of the superconducting wires onto the copper tape, which can be brought about by rolling the wires into the tape, it is, however, difficult to achieve between the superconductive material and the normal conductive metal a good contact having a contact resistance which is as small as possible. A low contact resistance is, however, highly desirable in order to make possible a reversible current transition between the superconductor and the normal conductor. In addition, during rolling of the superconductive wires into the copper tapes, there is the great danger that the copper will undergo a greater elongation than the superconductive material which is of a greater mechanical hardness and that the copper will moreover receive a rolling texture as a result of deformation of the copper during rolling. As a result of this texture, the residual resistance of the copper at the low cryostatic temperatures is increased, with the result that there is a reduction in electrical conductivity and thus an impairment of the stabilizing action.

It is accordingly a primary object of our invention to provide a method of manufacturing conductors composed of superconducting and normal conducting metals while avoiding the above difficulties and while at the same time achieving still further advantages.

In accordance with our invention at least one superconductor is fixedly connected over its entire length by ultrasonic welding with a normal conductor made of a metal such as copper or aluminum.

Preferably, a plurality of superconductors which extend parallel to each other are welded to the normal conductor. In this way, there is produced a conductor having several superconductors electrically connected in parallel with each other during operation of a superconducting coil made from the conductor of our invention with the capability of mutual relieving of the load in the event one of the superconductors becomes overloaded.

In order to manufacture the composite conductor of our invention it is preferred to use a superconductor made of a high-field superconductive material, such as, for example, wires or ribbons of superconductive niobium-zirconium and niobium-titanium alloys and tapes having layers of superconducting intermetallic compounds, preferably niobium-tin ($Nb_3Sn$). While the latter materials are particularly suitable for superconductors made of high-field superconductive materials, for special purposes it is also possible to use other so-called hard superconductors such as, for example, niobium.

With conductors manufactured according to the method of our invention, there is the outstanding advantage of an extremely small contact resistance between the superconductor and normal conductor. The passivation layers normally present particularly on superconductors such as alloys of niobium-zirconium and niobium-titanium, and the thin oxide layers which are conventionally present on the exterior surfaces of normal conductors of aluminum and copper, which prevent good electrical contact between the metals, are for the most part destroyed as a result of the ultrasonic welding process, so that an outstandingly good electrical contact between the metals is achieved. Inasmuch as the connection between the metals brought about by ultrasonic welding is very intimate, there is no possibility of a new formation of such passivation and oxide layers at the connections between the metals, so that the contact between the superconductor and normal conductor is highly resistant to aging. This is particularly true in the case where the superconductor is completely enclosed within the normal conducting metal. Furthermore, during ultrasonic welding there is no elongation and no substantial cold-working of the normal conductor. Only at the location of the weld itself is there a small localized deformation of the normal conductor, the major part of which maintains its cross section without any change. Thus, with the method of our invention the residual resistance of the normal conductor undergoes practically no increase.

In order to bring about an easy welding of the superconductor into the body of the normal conductor, when the normal conductor is made of copper it is preferred to use a soft-annealed copper. Thus SE-copper, namely copper of low oxygen content, is preferred because of its good electrical conductivity at low, cryostatic temperatures.

When a normal conductor made of aluminum is used with the method of our invention, it is possible to achieve additional particular advantages. Thus, as compared to copper, aluminum has more than a three-times smaller specific weight, a lower recrystallization temperature, a greater ductility, and if made of sufficient purity a better electrical conductivity at the low temperatures, as well as a better thermal conductivity and a smaller specific heat. Thus, it is possible to achieve with aluminum, because of its better electrical values, an even better stabilizing action at low cryostatic temperatures than with copper. Moreover, by using aluminum the weight of the superconductive coil is substantially reduced, and this factor is of particular significance with relatively large magnets. Because of its particularly low residual resistance at cryostatic temperatures, it is preferred to use aluminum of a purity of at least 99.95%. Especially when aluminum is used as a normal conductor, it is of special significance that with the method of our invention the ultrasonic welding destroys the oxide layer which is normally encountered on the aluminum, since otherwise an intimate contact between the aluminum and the superconductor would be prevented. Only through ultrasonic welding is a good contact between aluminum and the superconductor brought about. Aluminum has at temperatures below approximately 1.2° K. superconducting properties, but is nevertheless electrically of the normal conductivity during operation of the composite conductor of our invention which normally takes place at approximately 4.2° K., because of this low critical temperature and because of the low critical magnetic field of aluminum. Therefore, in the sense of our invention aluminum is to be considered as a normal conductor.

The connection between the superconductor and the normal conducting metal can be brought about in accordance with our invention in a number of different ways.

Perferably the superconductor is completely embedded in the normal conductor. In this way a good electrical contact between the superconductor at its entire exterior surface and the normal conducting metal is achieved. In order to embed the superconductor into the normal conducting metal, according to one embodiment of our invention the superconductor is completely pressed into a tape of normal conducting metal, so that the normal conductor closes itself for the most part over the superconductor. According to another embodiment of our invention the superconductor is entirely or partially pressed into a tape of normal conductivity by ultrasonic welding, and then a second tape which is made of the same metal as the first tape is ultrasonically welded onto the latter at the face thereof into which the superconductor is pressed. According to a further embodiment of a method according to our invention the superconductor is situated between a pair of normal conducting tapes and the tapes together with the superconductor therebetween are simultaneously welded together. For reasons of mechanical stability it can be of advantage in some cases to use for the latter method tapes respectively made of aluminum and copper. For special purposes it can also be of advantage to weld the superconductor onto a base which is preferably in the form of a tape and which forms the normal conductor. With this latter embodiment of our invention the superconductor is not completely enclosed within the normal conducting metal.

In order to embed the superconductor into the body of the normal conductor it is preferred to use superconductors in the form of wires or narrow ribbons. In order to weld the superconductor onto a normal conducting base, however, it is preferred to use superconductors of ribbon configuration.

In some cases it is of advantage to weld to the normal conductor superconductors which are provided at their exterior surfaces with a coating of the same normal conducting metal as that to which the superconductor is welded ultrasonically. With this latter method of our invention it is possible under certain circumstances to achieve a further improvement in the electrical contact between the superconductor and the normal conductor. In this latter connection it is in particular possible to use a superconductor which has been coated with an aluminum layer of a thickness of approximately 10–50$\mu$, in an electro-chemical manner, preferably in an aluminum-organic bath. With a coating of this latter type the exterior surface of the superconductor is protected against atmospheric influences even during long periods of storage.

In order to increase the mechanical strength of the composite conductor of our invention, it is possible in accordance with the method of our invention to ultrasonically weld onto the normal conductor a metal of high mechanical strength. Such metal-clad conductors are particularly suitable for large magnets where large forces are encountered within the windings. The welding of the superconductor and the metal of high strength to the normal conductor can take place simultaneously. According to another embodiment of the method of our invention, however, the connection of the superconductor to the normal conductor and the welding of the metal of high strength to the normal conductor can also take place during separate operations. In order to clad the composite conductor where copper is the normal conductor, a high-grade steel is particularly suitable because it has a coefficient of thermal expansion which is substantially identical with that of copper. In the case where a normal conductor of aluminum is used, it is of advantage to use for cladding purposes an aluminum alloy of high strength, such as, for example, duralumin or the so-called Aldrey-alloy made of aluminum, magnesium and silicon.

Furthermore, in accordance with the method of our invention, it is possible, in order to cure out the relatively small local deformations of the normal conductor, to provide a heat-treatment of relatively short duration after the ultrasonic welding. When aluminum is used as a normal conductor, the composite conductor can be heated for a period of from a few minutes up to one hour, preferably for a period of approximately 20 minutes, at a temperature of 200–300° C. When a soft-annealed copper is used as the normal conductor, a heat treatment of approximately five minutes can take place at a temperature of from 400–600° C. Whether or not such a heat treatment is to be carried out, depends upon the particular superconductor material which is used. When a predetermined superconducting alloy, such as, for example, niobium-33-zirconium, is used, the heat treatment can serve at the same time to increase the critical current and with ribbons of this superconducting alloy to remove the anisotropy of the superconductive material. With these latter superconducting alloys the heat treatment used during manufacture of the wire or tape can be eliminated. In the event that the heat treatment is provided, it can furthermore be of advantage to use as the normal conductor aluminum of a purity of more than 99.95%, which has been cold-worked or deformed to an extent of at least 10%. With a heat treatment for approximately five minutes at a temperature of 200–300° C., this cold-worked aluminum recrystallizes while curing out its faults, so that after the heat treatment a particularly low residual resistance is achieved.

In order to carry out the method of our invention it is particularly suitable to use an ultrasonic, continuous-seam welding machine. With sonotrodes of suitable configuration it is possible to weld several superconductors to the normal conductor simultaneously. By providing a parallel connection between a plurality of sonotrodes, it is also possible to fill relatively wide tapes of normal conducting metal with superconductive material. In order to bring about a good mechanical contact with the materials which are to be welded to each other, the exterior surfaces of the sonotrode and anvil rollers of the ultrasonic welding machine are roughened.

Our invention is illustrated by way of example in the accompanying drawings which form part of this application and in which:

FIG. 1 is a schematic illustration of an apparatus for carrying out the method of our invention;

FIGS. 2–5 are respectively schematic, perspective, fragmentary illustrations of different embodiments of conductors composed of superconducting and normal conducting metals and manufactured according to our invention; and FIGS. 6–9 are respectively schematic, perspective, fragmentary illustrations of different embodiments of conductors manufactured according to our invention and clad with a metal of high strength.

The structure which is schematically illustrated in FIG. 1 includes an ultrasonic, continuous-seam welding machine 1. Situated in front of the machine is a normal conductor 2 in tape form made, for example, of aluminum and unrolled from a supply roll 3. Also situated in front of the machine is a superconductor 4 made, for example, of niobium-zirconium wires and derived from a supply roll 5. These superconductive and normal conductive metals are situated in fixed positions relative to each other on a table 6 by way of guide rollers 7. Then these metals are welded to each other between the sonotrode 8 and the anvil roller 9 of the ultrasonic welding machine 1. The further transportation of the conductor is brought about by way of the rotary movement of the sonotrode 8 and the anvil roll 9. The finished composite conductor is wound onto a motor-driven roll 10. In order to carry out the method of our invention ultrasonic, continuous-seam welding machines which are of conventional construction and which can be purchased anywhere, are suitable. The particular examples referred to below were manufactured on an ultrasonic welding machine made by the Dr. Lehfeldt Company, Type RPMA 22/2500. This machine was supplied with energy from a high-frequency generator whose rated high frequency power was 2.4 kw. and whose frequency was 21.7 kHz. The roller type of sonotrode, which feeds the mechanical vibrations which are generated to the work which is to be welded, as well as the anvil roller are provided at their exterior surfaces with different irregularities so as to have a certain roughness at their exterior surfaces. The degree of roughness is adapted to the thickness of the materials which are to be welded. In accordance with the depth of the irregularities the rollers are preferably knurled or sand-blasted. Because of these surface irrgularities or roughness the rollers provide a better transportation of the parts which are to be welded, bring about a concentration of friction at the location where the welding is to be produced, and assure a faultless movement of the parts which are to be welded. The particular sonotrode which was used had over its entire length a uniform diameter of approximately 40 mm. The width of the anvil roller which determines the width of the weldment seam was 20 mm.

Figure 2:
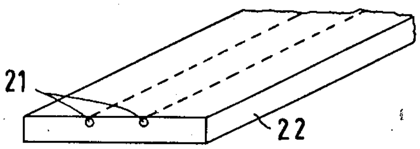

In order to manufacture the structure shown in FIG. 2, a pair of niobium-zirconium wires 21 of 0.25 mm. thickness were used, and these wires were embedded within a tape of aluminum having a thickness of 1 mm. and a width of 2 cm. Under the action of the pressure and the vibrations of the ultrasonic welding, the hard niobium-zirconium wire worked itself into the soft aluminum while the latter closed itself for the most part over these wires. The depth of the irregularities at the roughened surface of the sonotrode was on the order of 0.03 mm., the high frequency power was approximately 180 watts, and the pressure exerted at the welding location was approximately 50 kp., while the welding speed was on the order of 1 m. per minute.

Figure 3:
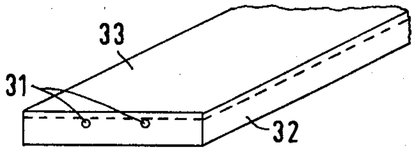

In order to manufacture the composite conductor shown in FIG. 3, a pair of niobium-zirconium wires 31 of 0.25 mm. thickness were initially situated on an aluminum tape 32 having a thickness of 1 mm. During a first operation the sonotrode rolled over these wires to weld them into the aluminum tape ultrasonically. Then a second aluminum tape 33 having a thickness of approximately 0.3 mm. was placed on the tape 32 at the face thereof into which the wires 31 were compressed and welded, and during a second operation during which the sonotrode rolled over this second layer 33 the latter was welded as a covering layer onto the first layer 32. The welding conditions used during the first operation correspond to the welding conditions used in the manufacture of the tape of FIG. 2. In order to weld the second aluminum tape 33 the high frequency power was increased to 1600 watts and the pressure was increased to approximately 130 kp. The welding speed during the second operation was 0.4 m. per minute.

Figure 4:
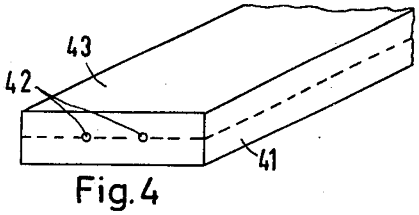

The composite conductor of FIG. 4 was manufactured in a single operation. A pair of niobium-zirconium wires 42 having a thickness of 0.25 mm. were placed on an aluminum tape 41 having a thickness of 1 mm., and a second aluminum tape 43 also having a thickness of 1 mm. was placed on top of the niobium-zirconium wires 42. During a single pass beneath the sonotrode the normal conductors and superconductors were welded together. The depth of the irregularities at the surface of the sonotrode was on the order of 0.2 mm., the high frequency power was 2400 watts, the compressive force was on the order of 130 kp., and the speed of feed during the welding was on the order of 0.4 m. per minute.

In a similar manner niobium-zirconium wires provided with thin aluminum coatings in aluminum baths were welded. The aluminum used for the tapes had a purity of 99.99%. Tapes in etched as well as in non-etched condition were used for the manufacture of the composite conductors. As shown by photomicrographs, the oxide layers present at the exterior surface of the aluminum were destroyed by the ultrasonic welding, so that a good thermal contact and a good electrical contact between the superconductor and aluminum tape was achieved.

Figure 5:
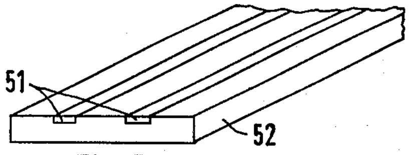

The composite conductor of FIG. 5 includes a pair of narrow niobium-zirconium ribbons 51 ultrasonically welded onto an aluminum tape 52. In this case the superconductive material was not completely enclosed within the normal conductor.

Figure 6:
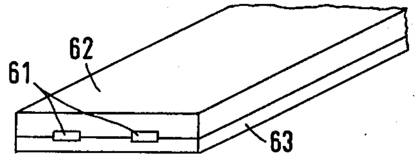

FIG. 6 shows a clad conductor manufactured in accordance with our invention in a single operation. A pair of niobium-zirconium ribbons 61 were simultaneously welded ultrasonically to an aluminum tape 62 and a tape 63 made of a high-strength aluminum alloy. The hard superconductive material pressed itself during welding for the most part only into the relatively soft aluminum tape, which, however, at the same time was welded and fixed to the tape made of high-strength aluminum alloy.

Figure 7:
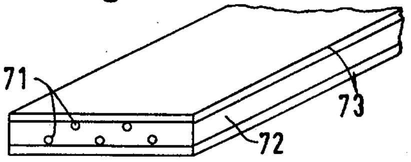

FIG. 7 shows a clad conductor wherein several superconducting wires 71 are ultrasonically welded into a normal conductor 72 made of copper, at both sides of the latter. On these two sides of the conductor relatively thin tapes 73 of high-grade steel were also welded ultrasonically.

Figure 8:
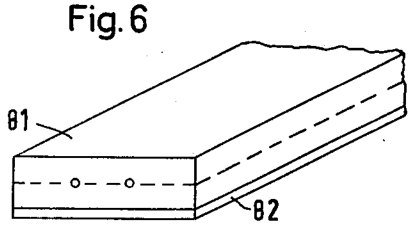

FIG. 8 shows a clad conductor wherein a composite conductor 81 having the structure of FIG. 4 is welded at one side to a tape 82 of high-strength material.

Figure 9:
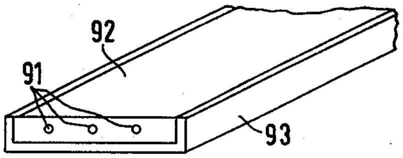

In FIG. 9 a composite conductor made of the superconducting wires 91 and the normal conductor 92 is ultrasonically welded with a profiled tape 93 of a material of high mechanical strength.

The method of our invention can be advantageously used for the manufacture of long lengths of electrically stabilized conductors of tape configuration, these conductors being particularly useful in connection with superconductive magnetic coils. Particularly when aluminum is used as the normal conductor, there is the further advantage that when the superconductor is embedded within the aluminum there are only localized elevations in temperature of relatively small amounts which at a maximum is on the order of 200–300° C. Thus, even thermally sensitive superconductive materials can be used to manufacture the composite conductor with the method of our invention without any impairment of their superconducting qualities. Moreover, dangerous formation of alloys between the superconductor and the normal conductor during ultrasonic welding is prevented.

We claim:

1. A method of manufacturing conductors composed of components of super and normal conductivity, comprising the steps of placing at least one elongated superconductor in engagement with one face of a first tape which forms part of a normal conductor, ultrasonically welding said superconductor to said normal conductor along the entire length thereof so as to at least partially embed said superconductor therein, and then ultrasonically welding onto said face of said first tape a second tape which forms another part of said normal conductor and is made of the same metal as said first tape.

2. A method of manufacturing conductors composed of components of super and normal conductivity, comprising the steps of placing at least one elongated superconductor between the adjacent faces of a pair of tapes which are parts of a normal conductor, and ultrasonically welding said tapes and superconductor to each other simultaneously.

3. The method of claim 2 wherein said normal conductor is a metal selected from the group consisting of copper and aluminum.

4. The method of claim 2 wherein a plurality of elongated superconductors which extend parallel to each other are welded to said normal conductor.

5. The combination of claim 2 wherein said superconductor is made of a high-field superconductive material.

6. The method of claim 2 wherein said normal conductor is a soft-annealed copper.

7. The method of claim 2 wherein said normal conductor is aluminum having a purity of at least 99.95%.

8. The method of claim 2 wherein said tapes are respectively made of aluminum and copper.

9. A method of manufacturing conductors composed of components of super and normal conductivity, comprising the steps of ultrasonically welding at least one elongated superconductor to a normal conductor along the entire length thereof, and then ultrasonically welding a metal of high mechanical strength to said normal conductor.

10. A method of manufacturing conductors composed of components of super and normal conductivity, comprising the steps of cold-working a normal conductor to an extent of at least 10%, said conductor being an aluminum tape having a purity of at least 99.95%, ultrasonically welding at least one elongated superconductor to said normal conductor along the entire length thereof, and then heat treating the welded conductors at a temperature of approximately 200–300° C. for a period of approximately five minutes.

11. A method of manufacturing conductors composed of components of super and normal conductivity, comprising the step of ultrasonically welding at least one elongated superconductor to a normal conductor along the entire length thereof, said welding step being performed in an ultrasonic continuous seam welding machine having sonotrode and anvil rollers provided with roughened exterior surfaces which engage the conductors.

12. A method of manufacturing conductors composed of components of super and normal conductivity, comprising the steps of ultrasonically welding at least one elongated superconductor to a normal conductor along the entire length thereof, and then heat treating the welded conductors.

13. The method of claim 12 wherein said normal conductor is aluminum, the conductors which are ultrasonically welded to each other being subjected to a heat treatment at a temperature of approximately 200–300° C. for a period of from a few minutes up to approximately on hour.

14. The method of claim 12 wherein the normal conductor is a soft-annealed copper, and the ultrasonically welded conductors being subjected to a heat treatment at a temperature of from approximately 500–600° C. for a period of approximately five minutes.

References Cited

UNITED STATES PATENTS

| | | | |
|---|---|---|---|
| 2,985,954 | 5/1961 | Jones et al. | 29—470.1 X |
| 3,109,963 | 11/1963 | Geballe | 29—599 |
| 3,191,055 | 6/1965 | Swihart et al. | 29—599 |
| 3,201,862 | 8/1965 | Gotoh | 29—470.5 X |
| 3,218,693 | 11/1965 | Allen et al. | 29—599 |

PAUL M. COHEN, Primary Examiner

U.S. Cl. X.R.

29—194, 470.1, 472.3